United States Patent

Acosta et al.

[11] Patent Number: 5,958,631
[45] Date of Patent: Sep. 28, 1999

[54] X-RAY MASK STRUCTURE

[75] Inventors: Raul E. Acosta, White Plains, N.Y.;
Juan R. Maldonado, Melo Park, Calif.

[73] Assignee: International Business Machines Corporation, Armonk, N.Y.

[21] Appl. No.: 09/024,087

[22] Filed: Feb. 17, 1998

[51] Int. Cl.$^6$ .................................................. G03F 9/00
[52] U.S. Cl. ........................ 430/5; 430/322; 378/34; 378/35
[58] Field of Search ................. 430/5, 322; 378/34, 378/35

[56] References Cited

U.S. PATENT DOCUMENTS

| | | | |
|---|---|---|---|
| 4,037,111 | 7/1977 | Coquin et al. | 250/505 |
| 4,260,670 | 4/1981 | Burns | 430/5 |
| 4,592,081 | 5/1986 | Eaton et al. | 378/34 |
| 4,634,643 | 1/1987 | Suzuki | 430/5 |
| 4,964,145 | 10/1990 | Maldonado | 378/35 |
| 4,998,267 | 3/1991 | Lee et al. | 430/5 |
| 5,124,561 | 6/1992 | Faure et al. | 250/505.1 |
| 5,155,749 | 10/1992 | DiMilia et al. | 378/35 |
| 5,504,793 | 4/1996 | Chen | 378/34 |

FOREIGN PATENT DOCUMENTS 63-072119  4/1988  Japan.
64-013551  1/1989  Japan.

OTHER PUBLICATIONS

"Method to Adjust Magnification in X–Ray Masks," *IBM Technical Disclosure Bulletin*, vol. 38 No. 08, pp. 179, Aug. 1995.

"Method to Adjust Magnification and Distortion in X–Ray Masks," *IBM Techinical Disclosure Bulletin*, vol. 38 No. 08, pp. 67–68, Aug. 1995.

*Primary Examiner*—S. Rosasco
*Attorney, Agent, or Firm*—Ratner & Prestia; Tiffany L. Townsend

[57] ABSTRACT

A universal mask for use in making Integrated Circuits. The individual size masks are produced on a wafer having standardized, large size membrane area. A combined X-ray blocking and membrane stiffening layer is applied on at least one side of the wafer. This stiffening/blocking layer includes an X-ray transparent region having a size commensurate with the desired exposure field and aligned therewith.

13 Claims, 4 Drawing Sheets

X-RAY MASK STRUCTURE

TECHNICAL FIELD

The present invention relates to x-ray masks and more particularly to a universal size mask having good resistance to warpage and defining any desired exposure field.

BACKGROUND OF THE INVENTION

Integrated Circuit (IC) technology has developed to a point where a large number of complete circuits can be manufactured on the same semiconductor wafer using planar technology. The circuits are typically incorporated onto the wafer using photolithographic techniques. Each circuit can contain a large number of components such as transistors, diodes, resistors, capacitors, etc., which are electrically interconnected in preselected arrangements. After the circuit components are formed on the wafer, the wafer is tested and diced into individual chips comprising selected arrays of circuits, which are further processed and encapsulated into memory, logic or other ICs.

Photolithographic technology is widely used for forming the circuit patterns on the semiconductor wafers where good resolution and high yield are required. Using optical stepping techniques, the patterns initially formed on an optical mask substrate can be transferred optically onto a photoresist layer of a wafer by a step and repeat method. The step and repeat method comprises moving the mask, which contains the pattern for a portion of the wafer, to an unexposed section of the wafer and using electromagnetic radiation to image the mask pattern onto the wafer. After the pattern is imaged, the wafer is moved and the exposure is repeated. The step and repeat method for each photolithographic step continues until the entire wafer has been exposed.

The original photolithographic techniques used a photoresist layer over the wafer and ultraviolet or natural light to expose the patterns on the wafer. However, ultraviolet and natural light techniques have resolution limitations. The resolution ultimately obtained in the resist is limited by, among other factors, the wavelength of the incident light.

In part because of this limitation, X-ray lithography was developed to take advantage of the shorter wavelengths of the soft X-rays to expose appropriate patterns in the resists. The wavelength of the X-rays generally range from about 0.1 to 1.0 nanometers, which significantly improves the resolution and circuit yield per wafer associated with lithography.

During X-ray lithography, an X-ray source such as a synchrotron is used to direct an intense collimated beam of X-rays through an X-ray mask overlying a photoresist layer of a semiconductor wafer. The mask includes a central, X-ray transparent region which contains selected patterns formed of X-ray absorbing material. The X-rays expose patterns on the underlying photoresist layer that correspond to the X-ray absorbing material patterns.

To form the X-ray mask for use in X-ray lithography, a flat wafer formed from X-ray opaque material, e.g., silicon, is used as a substrate. The substrate has a central region etched to a thin tensile membrane using conventional etching techniques, e.g. diffusing an appropriate dopant into the substrate as an etch-stop. The substrate is bonded to a support ring to provide support and stability for the mask. An X-ray absorbing material, e.g., gold, is then selectively deposited on the upper surface of the wafer in the central region in an appropriate circuit pattern by techniques such as electroplating.

In an alternate embodiment, there is grown on the surface of the wafer a thin layer of silicon carbide, silicon nitride or diamond, and the membrane is formed by etching the wafer substrate to the grown layer and forming the X-ray absorbing patterns on this layer.

Henceforth the term membrane will be used to refer to the region on the wafer which is X-ray transparent and supports the X-ray opaque pattern, regardless of the method used to create such region.

The finished mask is brought proximate to a positive-acting or negative-acting resist-covered semiconductor wafer, and X-rays are applied to expose corresponding resist patterns on the underlying semiconductor wafer.

Currently, the membrane size in x-ray masks is tailored to the particular chip size for which the mask is intended. As a result a manufacturer of chips must stock a large variety of membrane containing substrates for the different size membranes he may need. Substrates having universal or standardized membrane sizes sufficiently large to accommodate all chip sizes would be highly desirable, and some have been tried albeit with limited success.

The problem has been that such universal size membrane is by necessity large to accommodate the different size patterns for different size chips. The use of such large membranes, however, requires the use of shutters associated with the exposure equipment to prevent unwanted exposure of adjacent chips. Such shutters are cumbersome to use, requiring test pre-exposures to determine the shielded area, and are not always completely effective in preventing at least some irradiation of the non image membrane area and areas adjacent to the desired target area. In addition, partial irradiation of the membrane over time results in increased mask distortion due to radiation damage.

SUMMARY OF THE INVENTION

According to this invention there is proposed an x-ray mask which has good resistance to distortion and which uses a large, standardized size membrane to provide a mask for a desired size chip. Such an exposure mask, particularly useful in a lithography process for exposing a desired pattern within a predetermined size exposure field onto a chip, comprises:

a) A substantially X-ray opaque substrate which has parallel top and bottom surfaces and includes an X-ray transparent membrane.

b) A layer of an X-ray absorbing material on the membrane comprising the desired pattern; and c) A first X-ray blocking/stiffening layer, over at least a portion of the X-ray opaque body top surface and membrane top surface. The first blocking/stiffening layer has a first X-ray transparent mask frame region commensurate and aligned with the desired exposure field.

Usually the first X-ray blocking/stiffening layer comprises a refractory metal. In a preferred structure, the substrate includes a mesa and the membrane and the first X-ray blocking/stiffening layer are both contained in the mesa.

The substrate is attached to a ring base typically a NIST ring.

If desired, a second blocking/stiffening layer of X-ray absorbing material, which can again be a refractory metal, is placed over the substrate bottom surface. This layer also has an X-ray transparent framed region, corresponding to the first framed region of the first blocking/stiffening layer, and is aligned therewith.

DETAILED DESCRIPTION OF THE INVENTION

The invention will next be illustrated with reference to the figures wherein similar numbers indicate similar elements in all figures. All figures are schematic representations intended to illustrate the invention rather than depict an actual commercial embodiment. As such only such elements as are necessary to illustrate the invention are included and elements which are well known in the art and which are not essential in describing the invention have been eliminated from the figures to prevent clutter.

Figure 1:
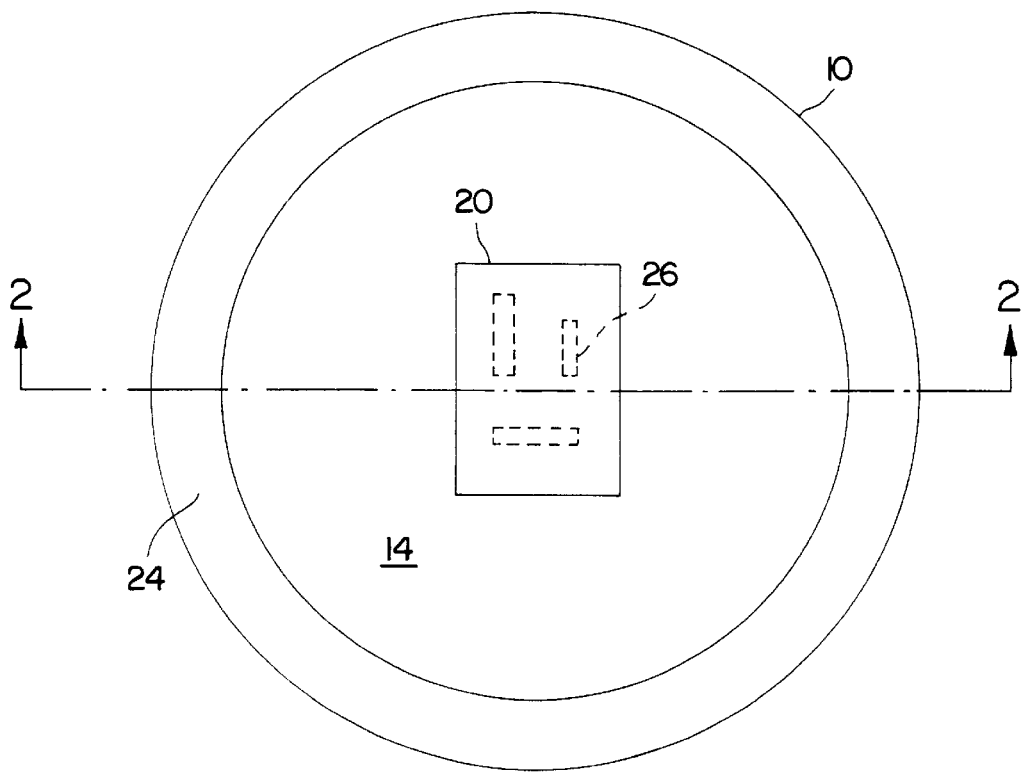
FIG. 1 shows a top view of a mask according to the prior art
Figure 2:
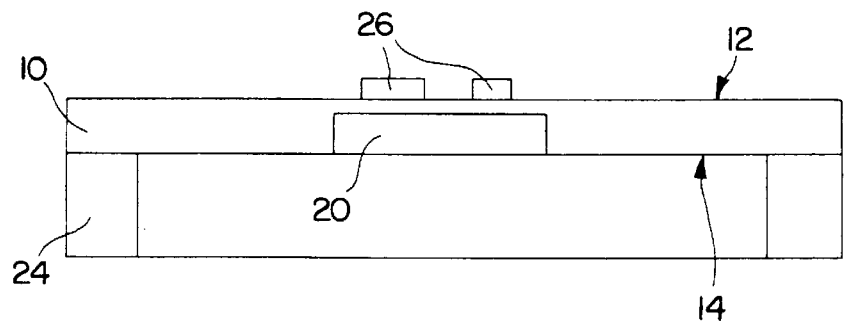
FIG. 2 shows an elevation cross section of the mask of FIG. 1 taken along arrows 2—2.

FIGS. 1 and 2 show different views of a typical prior art mask. As shown in FIGS. 1 and 2, an X-ray mask constructed according to conventional techniques comprises and X-ray opaque substrate 10, typically formed from monocrystalline silicon wafer, or other appropriate material, and having a substantially circular top plan view. The substrate 10 has substantially parallel top and bottom surfaces 12 and 14, respectively. The typical wafer used as a substrate 10 is about 100 mm in diameter and about 0.625 mm in thickness; however, other sizes, particularly other diameter wafers, may also be used.

Initially in the mask substrate fabrication process, an appropriate dopant, such as boron, is diffused into the top surface 12 and the bottom surface 14 of the wafer. The boron is caused to diffuse to a selected depth in the wafer and acts as an etch-stop during a subsequent etching step. A square central region 20 on the bottom surface 14 of the wafer is reactive ion etched through the boron doped depth to expose undoped silicon. The wafer is then chemically etched with an aqueous mixture of ethanolamine and pyrocatechol in the non-doped area to leave a thin tensile membrane in the central region. The thin membrane forms an X-ray translucent window about 2.5 $\mu$m thick which provides for increased X-ray transmission through the substrate material at the window region. Hereafter in this description we will use the term X-ray transparent to designate areas through which X-ray radiation is transmitted for exposing the substrate material, even though in certain embodiments the membrane may be only X-ray translucent.

The etching and doping techniques described above are well known techniques to those of ordinary skill in the silicon wafer fabrication art. Hence, no further discussion of these techniques is deemed necessary. Moreover, other etching techniques well known to those in the art are also within the scope of this invention. Additionally, other membrane materials suitable for X-ray mask application, e.g., silicon carbide, silicon nitride, diamond, etc. can also be used with the present invention.

During the subsequent X-ray mask fabrication steps, which are also well known to those of ordinary skill in the art, the peripheral region of the substrate 10 is bonded to an annular support ring 24, formed from glass or other appropriate material. The support ring 24 is about 10 mm wide and 10 mm thick, and imparts strength, integrity and a stable tension to the membrane region 20 of the substrate. While usually the support ring is circular, and may be an NIST ring, it is also known in the art to use square or parallelogram supports, and such non circular rings are also within the scope of the present invention. Stress balancing layers of the type disclosed in Faure et al. U.S. Pat. No. 5,124,561 may be included.

A layer 26 of X-ray absorbing material, e.g., gold, tungsten, tantalum, or other appropriate X-ray absorber, is then selectively deposited on the top surface 12 of the substrate. This deposition may be performed by conventional electroplating, or sputtering and subtraction patterns techniques, which are also well known to those in the art. For example, the X-ray absorbing material can be selectively deposited using the techniques described in Nakagawa, U.S. Pat. No. 4,881,257, which reduces deformations of the X-ray absorbing material in the X and Y directions. In any case, the X-ray absorbing material is deposited to form a circuit pattern on the mask membrane to be used in the lithography process. Additional conventional fabricating techniques may be used to complete and protect the patterns on the X-ray mask substrate, including the addition of protective layers which are not shown.

The finished X-ray mask 10 is installed in a X-ray lithographic stepper assembly to expose a portion of a resist-covered semiconductor wafer, for example as shown in Nakagawa, U.S. Pat. No. 4,881,257.

Figure 3:
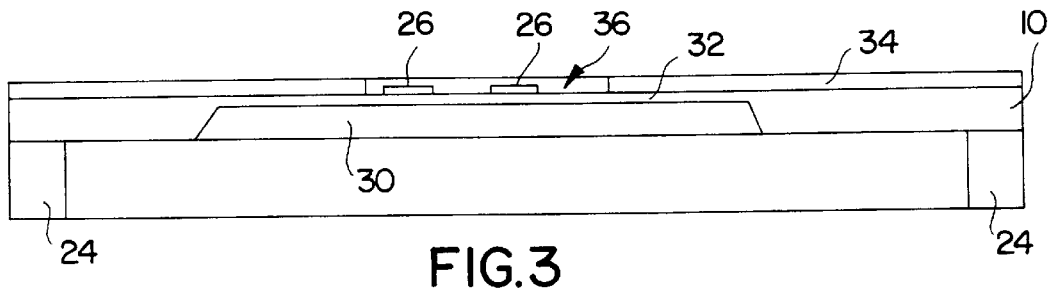
FIG. 3 shows an elevation cross sectional view of a mask according to this invention

FIG. 3 shows a mask produced according to this invention. This mask again comprises an X-ray opaque substrate 10, formed from monocrystalline silicon or other appropriate material, and having a substantially circular top plan view. Substrate 10 may again be a Silicon wafer. Using the same etching technology previously disclosed a portion 30 of the substrate is etched away to form a generally circular X-ray transparent membrane 32. However, contrary to the prior art teachings the size of this membrane does not correspond to any particular exposure field for a particular size chip, but is large enough to accommodate a plurality of different size exposure fields for different size chips.

Next there is deposited on top of the membrane a combined X-ray blocking/membrane stiffening layer 34 which is a layer, preferably of a high Young's modulus refractory metal, which substantially inhibits the passage of X-ray radiation, approximately 3 micrometers thick. Useful refractory metals include among others, Ta, TaSi, Ta$_4$B, and W. The refractory metals may be deposited as a single layer or a combination of multiple layers to form the blocking/stiffening layer 34.

In addition to functioning as a blocking layer for X-ray radiation, this layer simultaneously serves as a stiffening layer which provides a strong frame that supports the membrane against distortion particularly during attachment to the base ring.

Using an appropriate etch mask layer there is etched in the blocking/stiffening layer, over the membrane 32 a window 36 which is coextensive with the field of exposure for which the mask is prepared forming an X-ray transparent area framed by the blocking/stiffening layer. Of course the blocking/stiffening layer can also be deposited over the substrate leaving the area 36 uncovered to create the framed window area. Hereinafter this X-ray transparent region in the blocking/stiffening layer over the membrane will be referred to as a first X-ray transparent mask framed region.

The techniques for etching the blocking layer or for depositing such layer over a surface in a manner which leaves a region uncovered are well known in the art and a matter of choice for the practitioner.

A desired exposure pattern 26 of X-ray absorbent material such as, for instance, gold, Ta, TaSi, is next created on the membrane 32 within the framed window area. This is done using either a subtractive or an additive process and materials again in the manner well known in the art.

Figure 4:
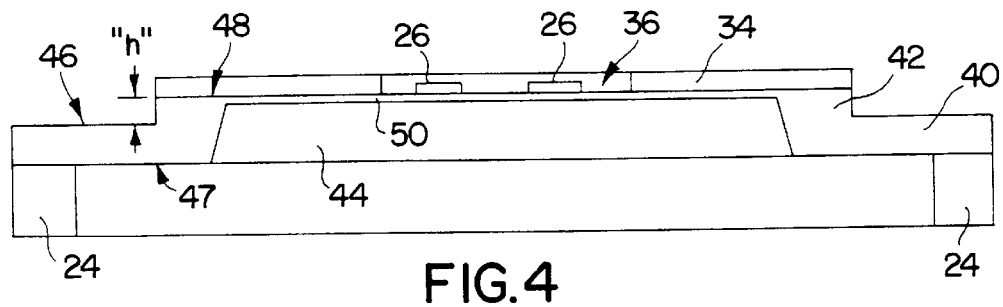
FIG. 4 shows an elevation cross sectional view of an alternate embodiment of a mask according to this invention.

FIG. 4 shows an alternate embodiment of the invention. In this embodiment, the substrate 40 includes a mesa 42. The substrate has substantially parallel top and bottom ring surfaces 46 and 47, respectively. The mesa 42 has a top 48. The top and bottom ring surfaces and the top mesa surface are all planar surfaces parallel to each other.

In one embodiment of this invention, the substrate 40 is a commercially available silicon wafer of about 100 mm in diameter and about 2 mm in thickness; The mesa 42 is also circular and concentric with the wafer, and has a diameter of about 57 mm. The top surface 48 of the mesa is raised above the top ring surface 46 by about 1 mm. However, other sizes, particularly other diameter wafers, may also be used, and the above dimensions are given for illustration rather than limitation of this invention.

An X-ray transparent membrane 50 is again formed on the substrate by etching the wafer through a mask to a predetermined depth using the techniques discussed above. As in the case of FIG. 3, the membrane size is not dimensioned to match a particular target size or a particular chip but is large enough to accommodate the largest expected desired target size. While it is illustrated as being square, it can also be circular or any other shape best suited for the intended use.

Next there is placed over the top surface 48 of the mesa 42 an X-ray blocking/stiffening layer 34 which again is preferably a high Young's modulus refractory metal. Again, such layer is typically about 3 $\mu$m thick.

As described previously, the blocking/stiffening layer does not cover the membrane completely but forms the first X-ray transparent mask framed region 36. This X-ray transparent framed region is once again sized to correspond to the desired exposure field for the particular chip for which the mask is intended. The blocking/stiffening layer again surrounds and frames the transparent region.

Following deposition of the blocking/stiffening layer and creation of the first framed region 36, the desired exposure pattern 26 is again placed on the membrane within the first framed region.

Figure 5:
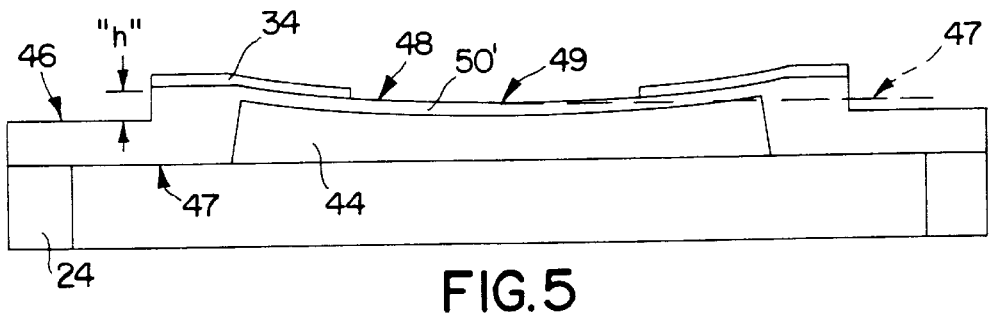
FIG. 5 illustrates the distortion in the membrane following attachment of the substrate onto a base.

As discussed earlier, the process of attaching the substrate to a supporting base, e.g. attaching a silicon wafer to an NIST or other support ring, results in some distortion of the membrane. The height "h" of the mesa is selected such that the membrane 50' does not deflect to a point such that any point on its top surface 48 is below the top surface 46 of the substrate, as shown in FIG. 5. As is shown in FIG. 5, the lowest point on the top surface of the membrane is point 49. A line 47 parallel to the substrate surface shows that point 49 has remained above surface 46 following attachment of the wafer to the supporting base ring 24.

Figure 6:
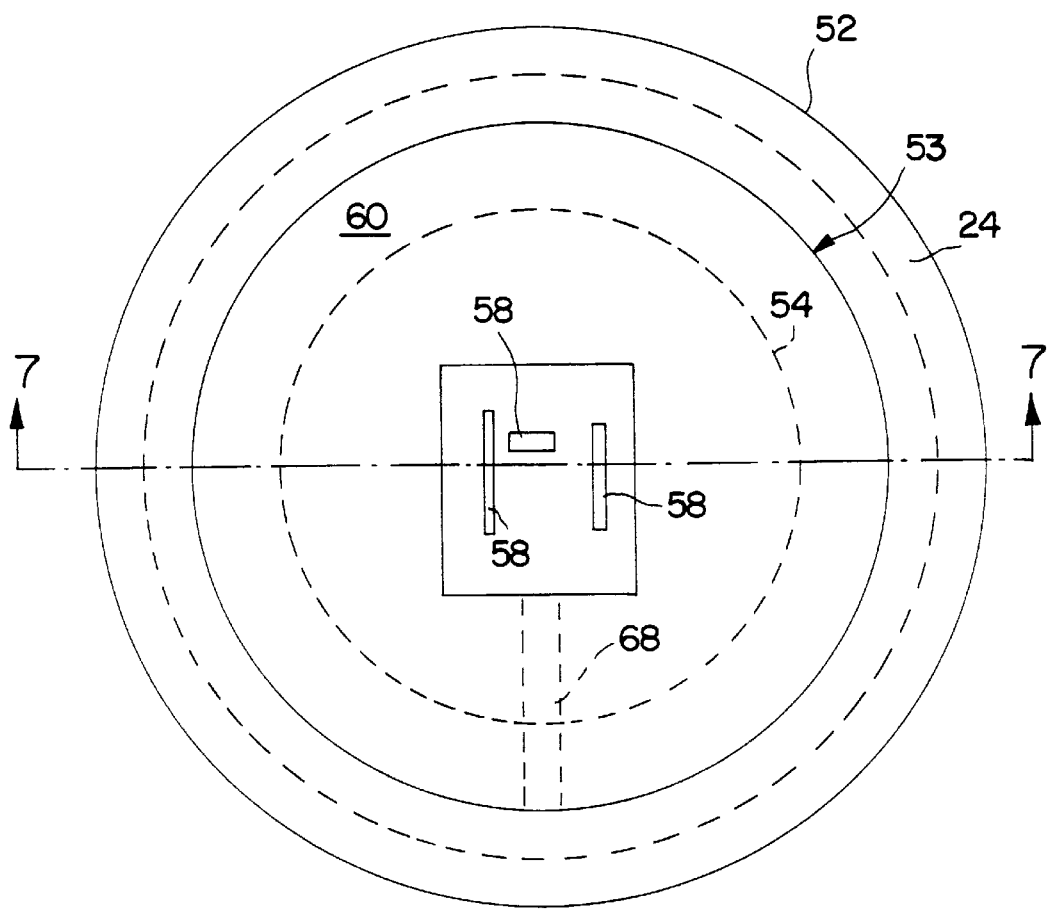
FIG. 6 shows a top view of yet another embodiment of a mask according to this invention.
Figure 7:
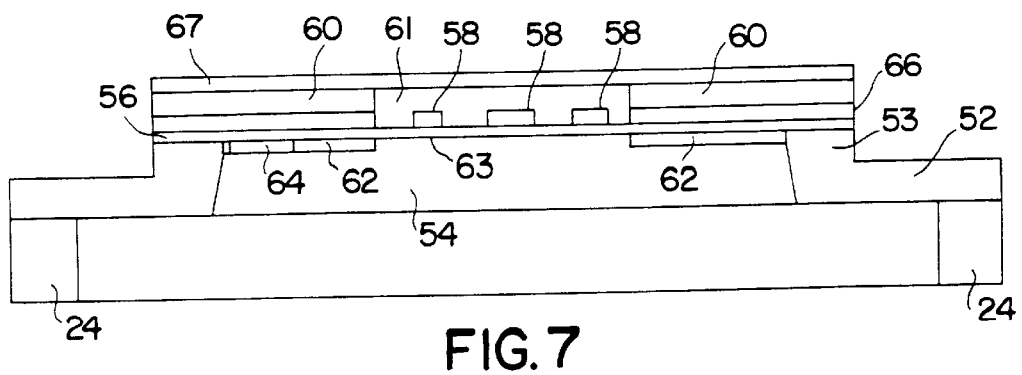
FIG. 7 shows an elevation cross section of the mask of FIG. 6 taken along arrows 7—7.

Referring next to FIGS. 6 & 7, there is illustrated yet another embodiment of this invention, wherein the mask includes a protective pellicle 67, and wherein the membrane comprises a layer 56 grown on the mesa 53 top surface. As shown, support 52 which may again be a Silicon wafer having a mesa 53, such as described earlier, has a portion 54 etched away to the membrane layer 56. This etched portion defines the largest target area available when using this type of membrane and exceeds all anticipated target areas for the chip sizes for which a mask using this support is intended.

The membrane layer 56 extends over the open area 54. In the illustrated embodiment, the target pattern 58 has been produced on this membrane layer 56 by a subtractive process wherein a radiation absorbing layer 66 is first coated over the membrane layer 56 and the target pattern is produced by selectively removing a portion of the radiation absorbing layer 66 in the exposure field leaving behind the desired pattern. As in the example given before this radiation absorbing layer is comprised of materials common in the art such as gold, tantalum, tantalum silicate, or any other useful such material which provides sufficient X-ray absorption to prevent exposing the radiation sensitive material on the chip, and which is conveniently etched to generate a desired pattern.

As in the case discussed earlier and illustrated in FIGS. 3 and 4, a radiation blocking/stiffening layer 60 having a first framed radiation transparent region 61 is placed over the radiation absorbing layer 66. First framed radiation transparent region 61 coincides with the exposure field for the desired chip.

Optionally, the mask may further comprise an additional protective layer or pellicle 67 formed over the radiation blocking/stiffening layer 60 such as a layer of a polymer material. The pellicle preferably extends over the full surface of the blocking/stiffening layer including the transparent mask frame region 61, and may include one or more pellicle ventilation channels (not shown).

Also optionally, a second radiation blocking/stiffening layer 62 is placed on the underside of the membrane 56. This second blocking/stiffening layer 62 also has a second framed radiation transparent region 63 which is substantially the same as the first framed transparent region and which is aligned with the first framed transparent region. This second layer serves to improve the blocking/stiffening of the X-ray stray radiation and to balance the strain on the pellicle due to the presence of the first blocking/stiffening layer 60.

Layer 62 may further comprise means 64 for adjusting the magnification of the pattern in the mask. Such means may be piezoelectric films or actuators, which may be used to correct magnification errors as disclosed in Maldonado, U.S. Pat. No. 4,964,145. Magnetostrictive layers may also be used for the same purpose. Such layers are typically externally actuated and serve to distort the membrane by applying stresses in a controlled manner to adjust the image size.

In an alternate embodiment, the membrane deforming elements may be embedded in the blocking/stiffening layer.

The blocking/stiffening layer may also contain an imbedded heating element for the same purpose, as disclosed in DiMilia et al. U.S. Pat. No. 5,155,749. Finally, the layer with the adjusting means may not be a blocking/stiffening layer.

Figure 6A:
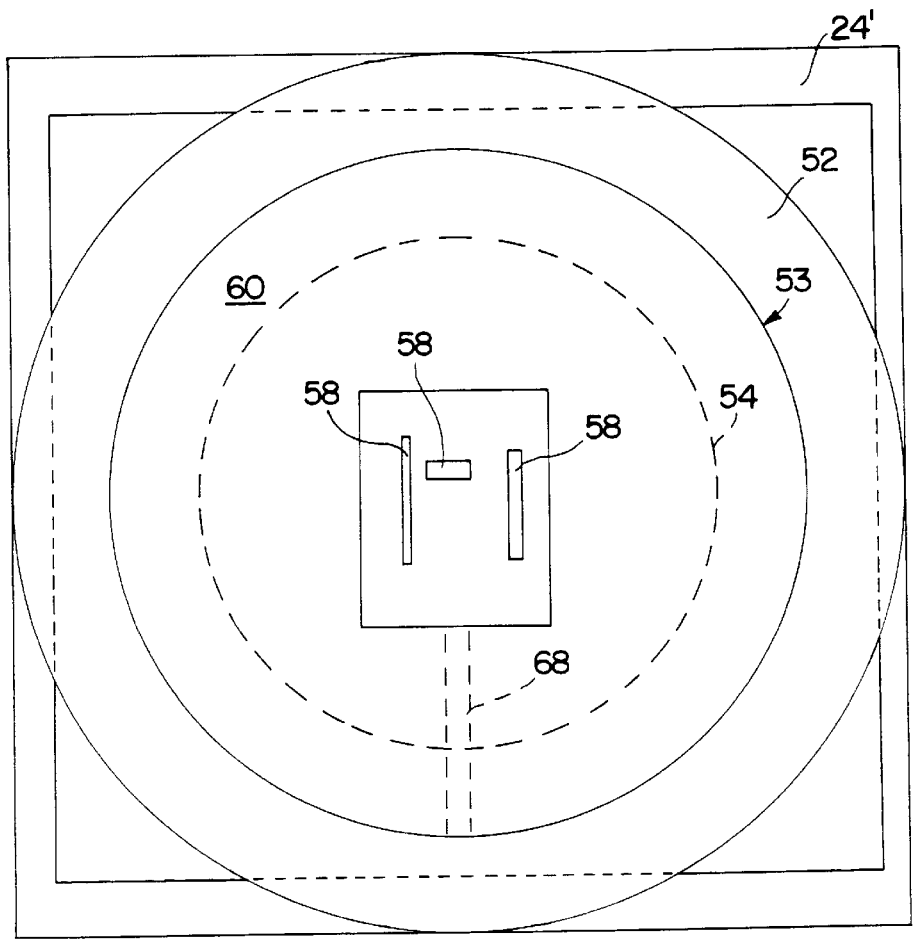
FIG. 6A shows a top view of the embodiment shown in FIG. 6 wherein the supporting base for the wafer is square.

FIG. 6A shows the same mask structure as shown in FIG. 6, however the support base 24' in this instance is square rather than circular.

In an alternate, preferred embodiment, the process of fabricating the mask is varied by holding the step of etching the silicon wafer to produce the membrane until after the radiation absorbing materials and the blocking/stiffening layers have been deposited on the wafer. This is advantageous because these steps normally require precise control of the deposition temperature which is difficult to achieve on a thin membrane. A membrane which is very thin has very little mass and is more difficult to maintain at a uniform temperature than the rest of the wafer. Therefore when these steps are performed prior to the etching step which removes most of the wafer to form the membrane, the steps are performed on a much thicker substrate which is better able to maintain at a uniform temperature.

Those skilled in the art having the benefit of the teachings of the present invention as hereinabove set forth, can effect numerous modifications thereto. These modifications are to be construed as being encompassed within the scope of the present invention as set forth in the appended claims.

We claim:

1. An exposure mask for use in a lithography process for exposing a desired pattern onto a chip, the mask comprising:
   a) a substantially X-ray opaque substrate having parallel top and bottom surfaces, the substrate including an X-ray transparent membrane also having a top and a bottom surface;
   b) a layer of an X-ray absorbing material on said membrane comprising a desired pattern; and
   c) a first X-ray blocking/stiffening layer, over at least a portion of said X-ray opaque body top surface and membrane top surface, said first blocking/stiffening layer having a first X-ray transparent mask frame region commensurate and aligned with the desired exposure field.

2. A mask according to claim 1 wherein the first X-ray blocking/stiffening layer comprises a refractory metal.

3. A mask according to claim 1 wherein said substrate includes a mesa and wherein the membrane is contained in the mesa.

4. A mask according to claim 3 wherein the first X-ray blocking/stiffening layer is over the mesa.

5. A mask according to claim 3 wherein the substrate is attached to a supporting base and wherein the mesa extends to a height over the substrate top surface to a level such that all points on the membrane top surface remain above the substrate top surface following attachment of the substrate to the supporting base.

6. A mask according to claim 5 wherein the substrate is a circular wafer and the supporting base comprises a NIST ring.

7. The mask according to claim 5 wherein the supporting base is square.

8. A mask according to claim 3 wherein the membrane comprises a layer grown on the mesa.

9. A mask according to claim 1 further comprising a second X-ray blocking/stiffening layer on the bottom surface of the membrane the second blocking/stiffening layer including a second frame region aligned with the first frame region.

10. A mask according to claim 8 wherein the second frame region is coextensive with the first frame region.

11. The mask according to claim 8 wherein the second blocking/stiffening layer comprises an externally actuated, membrane deforming element.

12. The mask according to claim 1 further including a back layer on the bottom membrane surface comprising an externally actuated, membrane deforming element.

13. The exposure mask of claim 1 wherein the X-ray transparent membrane encompasses a first area sufficiently large to universally accommodate a plurality of different chip sizes and in which the desired exposure field of the first X-ray transparent mask frame region in the blocking/stiffening layer corresponds to a specific chip size having a second area that is smaller than said first area.

* * * * *